US010620552B2

(12) United States Patent
Cox et al.

(10) Patent No.: US 10,620,552 B2
(45) Date of Patent: Apr. 14, 2020

(54) STAGE SYSTEM, LITHOGRAPHIC APPARATUS AND DEVICE MANUFACTURING METHOD

(71) Applicant: ASML Netherlands B.V., Veldhoven (NL)

(72) Inventors: Hendrikus Herman Marie Cox, Eindhoven (NL); Ronald Cornelis Gerardus Gijzen, Liempde (NL); Patrick Willem Paul Limpens, Uden (NL); Bart Friso Riedstra, Waalre (NL); Frits van der Meulen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/304,474

(22) PCT Filed: May 5, 2017

(86) PCT No.: PCT/EP2017/060738
§ 371 (c)(1),
(2) Date: Nov. 26, 2018

(87) PCT Pub. No.: WO2017/207211
PCT Pub. Date: Dec. 7, 2017

(65) Prior Publication Data
US 2019/0294057 A1    Sep. 26, 2019

(30) Foreign Application Priority Data

May 31, 2016    (EP) .................................... 16172139

(51) Int. Cl.
*G03B 27/58*    (2006.01)
*G03F 7/20*    (2006.01)
*H02K 41/03*    (2006.01)

(52) U.S. Cl.
CPC .......... *G03F 7/70758* (2013.01); *G03F 7/707* (2013.01); *G03F 7/709* (2013.01);
(Continued)

(58) Field of Classification Search
CPC ....... H01L 21/68; H01L 21/677; H01L 21/24; F16F 15/073; F16F 15/08; H02K 5/24;
(Continued)

(56) References Cited

U.S. PATENT DOCUMENTS 6,191,510 B1 *  2/2001  Landin ..................... H02K 1/04
                                                          310/216.016
6,756,751 B2 *  6/2004  Hunter .................... G03F 7/707
                                                          310/12.16
(Continued)

FOREIGN PATENT DOCUMENTS

CN    103226295 A    7/2013
CN    102880009 B    11/2014
(Continued)

OTHER PUBLICATIONS

Ole Andersen, European International Searching Authority, International Search Report, counterpart PCT Application No. PCT/EP2017/060738, dated Jul. 25, 2017, 5 pages total.
(Continued)

*Primary Examiner* — Christina A Riddle
(74) *Attorney, Agent, or Firm* — DiBerardino McGovern IP Group LLC

(57)    ABSTRACT

The invention pertains to a stage system, and to a lithographic apparatus and a method for manufacturing a device in which a stage system is used.
In the stage system a positioning system is provided comprising an actuator adapted to position an object table. The actuator comprises a magnet assembly and a coil assembly. The magnet assembly comprises a first magnetic body and a second magnetic body, which are in use subjected to a internal magnetic force.
(Continued)

The magnet assembly has a separate interface for connecting each magnetic body to the object table separately. The magnet assembly further comprises a spacer device, which holds the first and second magnetic body at a relative distance to each other in at least the direction of the internal magnetic force.

20 Claims, 10 Drawing Sheets

(52) U.S. Cl.
CPC ...... *G03F 7/70716* (2013.01); *G03F 7/70725* (2013.01); *G03F 7/70775* (2013.01); *G03F 7/70825* (2013.01); *G03F 7/70833* (2013.01); *H02K 41/031* (2013.01)

(58) Field of Classification Search
CPC ...... H02K 5/15; H02K 41/03; H02K 41/0354; H02K 41/0356; H02K 2201/18; H02K 1/12; H02K 1/18; H02K 1/182; H02K 1/187; H02K 1/185; H02K 15/03; F16B 2001/0035; G03F 7/70725; G03F 7/70691; G03F 7/70716; G03F 7/70733; G03F 7/70758; G03F 7/70775; G03F 7/708; G03F 7/70808; G03F 7/70825; G03F 7/70833; G03F 7/709; G03F 7/70975; G03F 7/7095

USPC .... 355/52, 53, 55, 72–77; 250/492.1, 492.2, 250/492.21, 492.22, 493.1
See application file for complete search history.

(56) References Cited

U.S. PATENT DOCUMENTS

| | | | |
|---|---|---|---|
| 2004/0145713 A1* | 7/2004 | Ono | G03B 27/42 355/53 |
| 2004/0246455 A1 | 12/2004 | Emoto | |
| 2005/0029981 A1 | 2/2005 | del Puerto | |
| 2016/0109814 A1 | 4/2016 | Westerhof | |

FOREIGN PATENT DOCUMENTS

| | | |
|---|---|---|
| CN | 105339845 A | 2/2016 |
| JP | 2004363259 A | 12/2004 |
| JP | 2005064507 A | 3/2005 |
| TW | 201530265 A | 8/2015 |
| WO | 2014064224 A1 | 5/2014 |

OTHER PUBLICATIONS

Ole Andersen, European International Searching Authority, Written Opinion, counterpart PCT Application No. PCT/EP2017/060738, dated Jul. 25, 2017, 5 pages total.

Office Action, counterpart Japanese Patent Application No. 2018-560203, dated Nov. 5, 2019, 7 pages total (including English translation of 4 pages).

* cited by examiner

STAGE SYSTEM, LITHOGRAPHIC APPARATUS AND DEVICE MANUFACTURING METHOD

CROSS-REFERENCE TO RELATED APPLICATIONS

This application claims priority of EP application 16172139.4 which was filed on 31 May 2016 and which is incorporated herein in its entirety by reference.

BACKGROUND

Field of the Invention

The present invention relates to a stage system, a lithographic apparatus and a method for manufacturing a device in which use is made of a stage system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

A lithographic apparatus often comprises a stage system for positioning the substrate and/or the patterning device. The substrate and the patterning device need to be positioned very accurately. Often, a positioning accuracy in the range of a few nanometres is required.

The positioning accuracy can be adversely affected by mechanical deformation of an object table of the stage system that supports a substrate or patterning device. Mechanical deformation of the object table may be caused by objects which are mounted to the object table and their dynamic behaviour. Such objects are for example actuators which are adapted to position the object table.

SUMMARY

It is desirable to provide a stage system in which the mechanical deformation of the object table is reduced.

According to an embodiment of the invention, there is provided a stage system for positioning an object, which stage system comprises:
an object table adapted to support the object to be positioned,
a positioning system adapted to position the object table, the positioning system comprising an actuator adapted to position the object table in a direction of actuation, which actuator comprises a magnet assembly and a coil assembly,
which magnet assembly comprises a first magnetic body and a second magnetic body, which first magnetic body and second magnetic body are in use subjected to an internal magnetic force,
wherein the coil assembly is fixed to the base and extends at least partly between the first magnetic body and the second magnetic body so as to in use generate a force in the direction of actuation,
wherein the magnet assembly is provided with a first interface which is adapted to connect the first magnetic body to the object table, and with a second interface which is adapted to connect the second magnetic body to the object table,
and wherein the magnet assembly further comprises a spacer device, which is adapted to hold the first magnetic body and the second magnetic body at a relative distance to each other in at least the direction of the internal magnetic force.

In another embodiment of the invention, there is provided a lithographic apparatus arranged to transfer a pattern from a patterning device onto a substrate, wherein the lithographic apparatus comprises a stage system according to the invention.

In another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the lithographic apparatus further comprises a positioning system adapted to position the substrate table, the positioning system comprising an actuator adapted to position the object table in a direction of actuation,
which actuator comprises a magnet assembly and a coil assembly,
which magnet assembly comprises a first magnetic body and a second magnetic body, which first magnetic body and second magnetic body are in use subjected to an internal magnetic force,
wherein the coil assembly is fixed to the Lase and extends at least partly between the first magnetic body and the second magnetic body, so as to in use generate a force in the direction of actuation,
wherein the magnet assembly is provided with a first interface which is adapted to connect the first magnetic body to the object table, and with a second interface which is adapted to connect the second magnetic body to the object table,
and wherein the magnet assembly further comprises a spacer device, which is adapted to hold the first magnetic body and the second magnetic body at a relative distance to each other in at least the direction of the internal magnetic force.

In another embodiment of the invention, there is provided a device manufacturing method comprising transferring a pattern from a patterning device onto a substrate, wherein use is made of a stage system according to claim 1.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
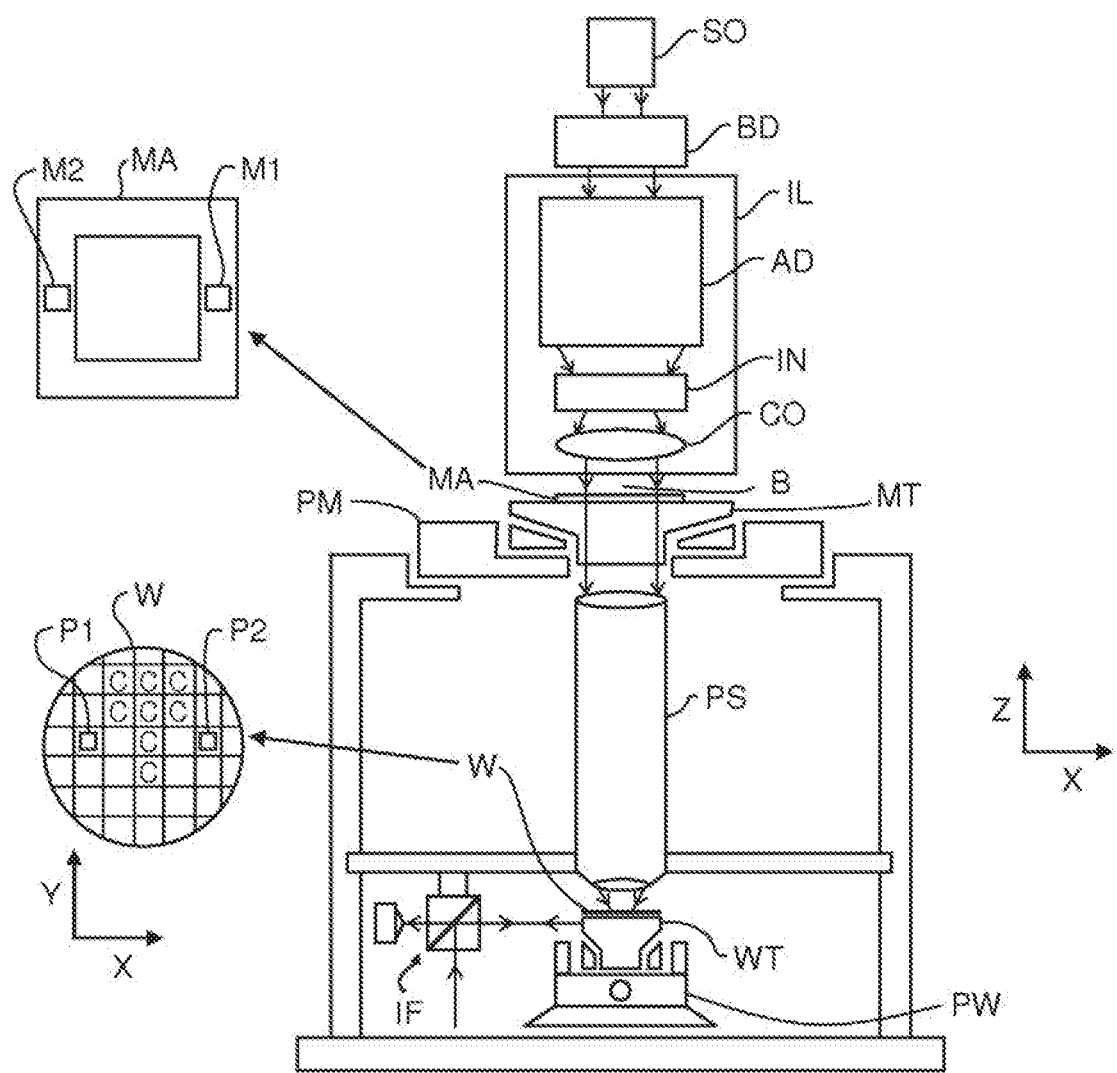
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table. WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
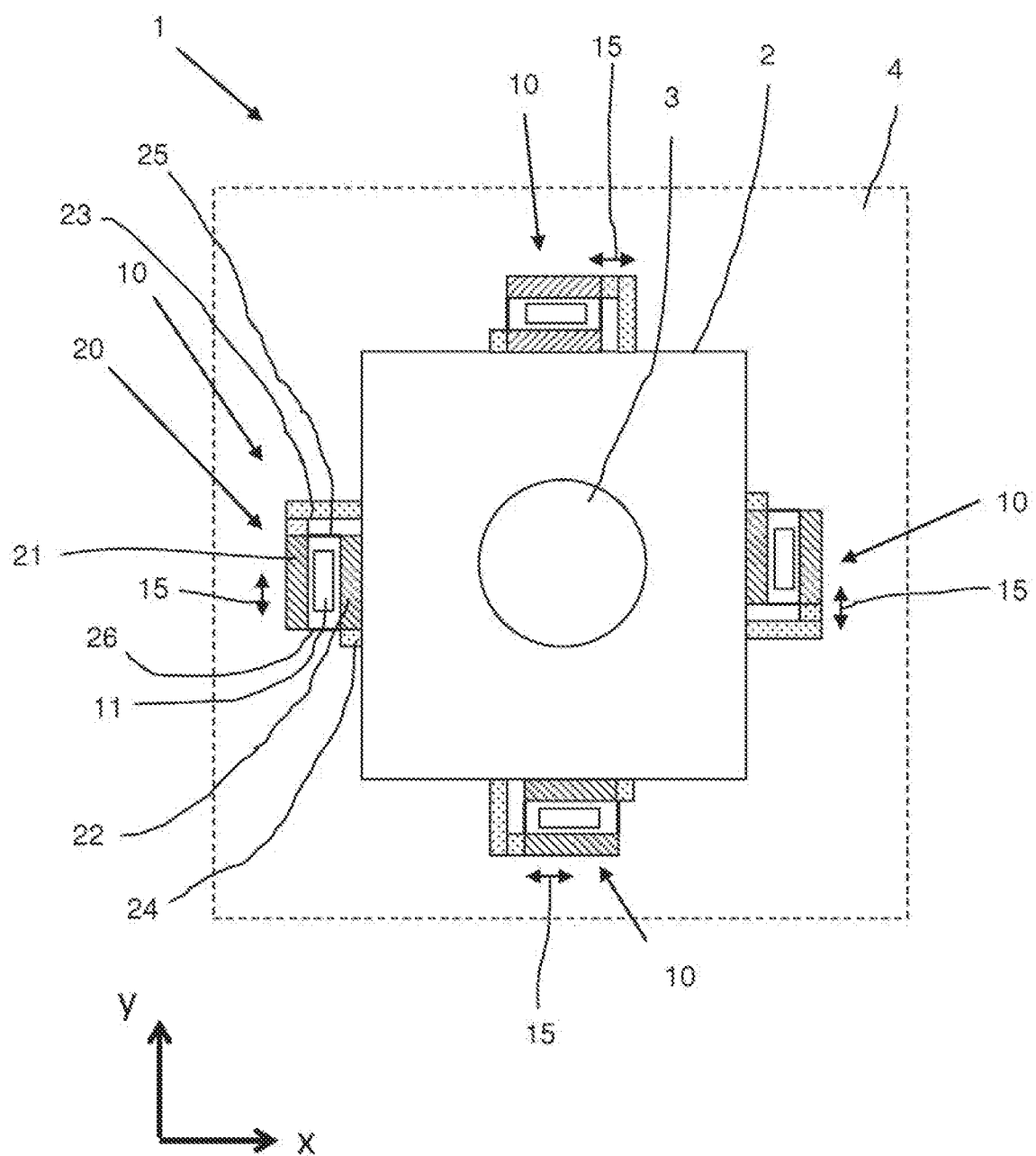
FIG. 2 shows a first embodiment of the stage system according to the invention.

FIG. 2 shows a first embodiment of the stage system 1 according to the invention.

The stage system 1 of FIG. 2 comprises an object table 2 which is adapted to support an object 3, for example a substrate. The object table 2 can for example be a substrate table. Optionally, the object table 2 comprises a mirror block.

The stage system 1 is adapted to position the object 3. Optionally, a base 4 is provided and the object 3 is positioned relative to the base 4. The base 4 is optionally stationary so that the base 4 can be regarded as the fixed world, or, alternatively, the base 4 is moveable relative to the fixed world. Optionally, the base 4 comprises a long stroke positioner.

The stage system 1 further comprises a positioning system which is adapted to position the object table 2. The positioning system is for example adapted to position the object table 2 in a two dimensional plane, which in FIG. 2 in the x-y plane. Optionally, the positioning system is adapted to position the object table 2 in six degrees of freedom. If a base 4 is present, the positioning system is optionally adapted to position the object table 2 relative to the base 4. Optionally, if the stage system is arranged in a lithographic apparatus which comprises a projection system, the positioning system is optionally adapted to position the object table 2 relative to the projection system.

The positioning system comprises an actuator 10 to position the object table 2 in a direction of actuation 15. In the embodiment of FIG. 2, four actuators 10 are provided. Two actuators are adapted to position the object table 2 in the x-direction and two actuators are adapted to position the object table 2 in the y-direction. In alternative embodiments, different numbers of actuators may be applied.

Each actuator 10 comprises a magnet assembly 20 and a coil assembly 11. The magnet assembly 20 comprises a first magnetic body 21 and a second magnetic body 22. The first magnetic body 21 and second magnetic body 22 are in use subjected to an internal magnetic force. In this embodiment, the first magnetic body 21 and the second magnetic body 22 are attracted to each other by the internal magnetic force. Alternatively, the first magnetic body 21 and the second magnetic body 22 may be repelled from to each other by the internal magnetic force. The internal magnetic force is in both cases directed perpendicular to the direction of actuation 15. In FIG. 2, the internal magnetic force is directed in the x-y plane. The first and/or second magnetic body 21, 22 comprises for example a magnet, e.g. a permanent magnet and/or an iron or ferromagnetic body element.

The coil assembly 11 extends at least partly between the first magnetic body 21 and the second magnetic body 22 so as to in use generate a force in the direction of actuation 15. If the optional base 4 is present, the coil assembly 11 is optionally connected to or fixed to the base 4.

The magnet assembly 20 is provided with first interface 23 which is adapted to connect the first magnetic body 21 to the object table 2, and with a second interface 24 which is adapted to connect the second magnetic body 22 to the object table 2. The first interface 23 and the second interface 24 are separate from each other.

The magnet assembly 20 further comprises a spacer device, which is adapted to hold the first magnetic body 21 and the second magnetic body 22 at a relative distance to each other in at least the direction of the internal magnetic force. In the embodiment shown in FIG. 2, the spacer device comprises a first spacer element 25 and a second spacer element 26. These spacer elements 25, 26 hold the first magnetic body 21 and the second magnetic body 22 spaced apart from each other at such a distance that at least a part of the coil assembly 11 can be arranged between, and at a distance from, the first and second magnetic body 21, 22. The spacer elements 25, 26 hold the first magnetic body 21 and the second magnetic body 22 spaced apart from each other against the action of the internal magnetic force.

The embodiment of FIG. 2 allows connecting the first and second magnetic body 21, 22 to the object table 2 in a very stiff manner, which results in an advantageous dynamic behaviour of the object table 2. This has a positive effect on the positioning accuracy that can be achieved. The dynamic behaviour of the object table with the actuators connected thereto is determined by among others the mass of the actuator or actuators and by the stiffness of the connection of an actuator to the object table. However, if the connection between an actuator and the object is made stiffer in one direction (e.g. the direction of actuation), the stiffness of that connection in other directions, also known as "parasitic stiffness", also increases. This results in that deformation of the actuator, e.g. due to heating or mounting, is transferred to the object table in the form of forces. It is advantageous to mount each magnetic body of an actuator to the object table separately. If two magnetic bodies of an actuator are mounted separately and in a stiff manner to the object table, the natural frequency is at least √2 (about 1.4) times higher than the natural frequency that occurs if the magnetic bodies share an interface which connects them to the object table together. However, during use the magnetic bodies are subjected to an internal magnetic force, e.g. an attracting force, which will deform the object table if no further measures are taken. This invention proposes to provide a spacer device which bears the internal magnetic force that is present between two magnetic bodies of an actuator. The spacer device defines at least one degree of freedom of each magnetic body. The remaining degrees of freedom of each magnetic body are defined by the interface that connects that magnetic body to the object table. The interface can provide the connection in these, degrees of freedom with a relatively high stiffness. This results in improved dynamic behaviour of the object table with the actuator or actuators mounted thereon, resulting e.g. in a high servo bandwidth of the actuator or actuators, without increasing deformation by parasitic stiffness of the object table.

Optionally, the stage system of FIG. 2 further comprises a positioning. measurement system. The positioning measurement system measures a position of the object table 2, for example a position of the object table 2 or a part of the object table 2 in at least one direction relative to a reference. The position measurement system may be encoder based or interferometer based. The position measurement system optionally comprises a sensor portion and a target portion. The reference is for example provided on a base (if present) or if the stage system is arranged in a lithographic apparatus which comprises a projection system, the reference is for example provided on the projection system.

If the position measurement system is encoder based, the position measurement system optionally comprises a grating, e.g. a one dimensional or two dimensional grating, which is for example arranged on the projection system and an encoder head, which comprises a beam source and at least one sensor adapted to received the beam from the grating, which encoder head is for example arranged on the object table. Alternatively, the grating may be arranged on the object table and the encoder head may be arranged on the projection system.

If the position measurement system is interferometer based, the position measurement system comprises a mirror which is for example arranged on the object table 2, a source for an optical beam and a sensor which is adapted to receive the beam from the mirror. The source for the optical beam is arranged such that the optical beam strikes the mirror on the object table 2. Alternatively, the mirror may for example be arranged on the projection system.

In a possible variant of the embodiment of FIG. 2, the spacer device is adapted to define the position of the first magnetic body 21 in at least one degree of freedom. The first interface 23 is adapted to define the position of the first magnetic body 21 in the remaining degrees of freedom.

Optionally, the spacer device is adapted to define the position of the first magnetic body 21 in at least the direction of the internal magnetic force.

A body has six degrees of freedom to define its position in a space: three translational degrees of freedom and three rotational degrees of freedom. The translational degrees of freedom are generally referred to as the directions x, y and z in a Carthesian coordinate system. The directions x, y and z and mutually perpendicular. The rotational degrees of freedom are generally referred to as the directions rx, ry and rz, wherein rx is a rotation with a rotation axis in the x direction, ry is a rotation with a rotation axis in the y direction and rz is a rotation with a rotation axis in the z direction.

If the positioning system is adapted to position the object table 2 in the x-y plane, and the direction of actuation 15 of an actuator 10 is the x direction, the internal magnetic force in that actuator 10 is directed in the y direction. In this variant of the embodiment of FIG. 2, the spacer device is adapted to define the position of the first magnetic body 21 in at least the y direction. Optionally, the first interface 23 is adapted to define the position of the first magnetic body 21 only in the degrees of freedom that are not defined by the spacer device.

If the positioning system is adapted to position the object table 2 in the x-y plane, and the direction of actuation 15 of an actuator 10 is the y direction, the internal magnetic force in that actuator 10 is directed in the x direction. In this variant of the embodiment of FIG. 2, the spacer device is adapted to define the position of the first magnetic body 21 in at least the x direction. Optionally, the first interface 23 is adapted to define the position of the first magnetic body 21 only in the degrees of freedom that are not defined by the spacer device.

Optionally, the first interface 23 defines the position of the first magnetic body 21 at least in the direction of actuation 15.

Alternatively or in addition, the spacer device is adapted to define the position of the second magnetic body 22 in at least one degree of freedom. The second interface 24 is adapted to define the position of the second magnetic body 22 in the remaining degrees of freedom.

Optionally, the spacer device is adapted to define the position of the second magnetic body 22 in at least the direction of the internal magnetic force.

A body has six degrees of freedom to define its position in a space: three translational degrees of freedom and three rotational degrees of freedom. The translational degrees of freedom are generally referred to as the directions x, y and z in a Carthesian coordinate system. The directions x, y and z and mutually perpendicular. The rotational degrees of freedom are generally referred to as the directions rx, ry and rz, wherein rx is a rotation with a rotation axis in the x direction, ry is a rotation with a rotation axis in the y direction and rz is a rotation with a rotation axis in the z direction.

If the positioning system is adapted to position the object table 2 in the x-y plane, and the direction of actuation 15 of an actuator 10 is the x direction, the internal magnetic force in that actuator 10 is directed in the y direction. In this variant of the embodiment of FIG. 2, the spacer device is adapted to define the position of the second magnetic body 22 in at least the y direction. Optionally, the second interface 24 is adapted to define the position of the second magnetic body 22 only in the degrees of freedom that are not defined by the spacer device.

If the positioning system is adapted to position the object table 2 in the x-y plane, and the direction of actuation 15 of an actuator 10 is the y direction, the internal magnetic force in that actuator 10 is directed in the x direction. In this variant of the embodiment of FIG. 2, the spacer is adapted to define the position of the second magnetic body 22 in at least the x direction. Optionally, the second interface 24 is adapted to define the position of the second magnetic body 22 only in the degrees of freedom that are not defined by the spacer device.

Optionally, the second interface 24 defines the position of the second magnetic body 22 at least in the direction of actuation 15.

If the spacer device and the first interface 23 together define all degrees of freedom of the first magnetic body 21 only once, a kinematic mounting (also known as "statically determined mounting") of the first magnetic body 21 is achieved. This reduces the local mechanical deformation of the object table 2 at the location where the first magnetic body 21 is mounted.

If the spacer device and the second interface 24 together define all degrees of freedom of the second magnetic body 22 only once, a kinematic mounting of the second magnetic body 22 is achieved. This reduces the local mechanical deformation of the object table 2 at the location where the second magnetic body 22 is mounted.

If the spacer device and the first interface 23 together define all degrees of freedom of the first magnetic body 21 only once and the spacer device and the second interface 24 together define all degrees of freedom of the second magnetic body 22 only once, a kinematic mounting of the both magnetic bodies 21, 22 is achieved. This reduces the local mechanical deformation of the object table 2 at the location where the actuator is mounted.

Figure 3:
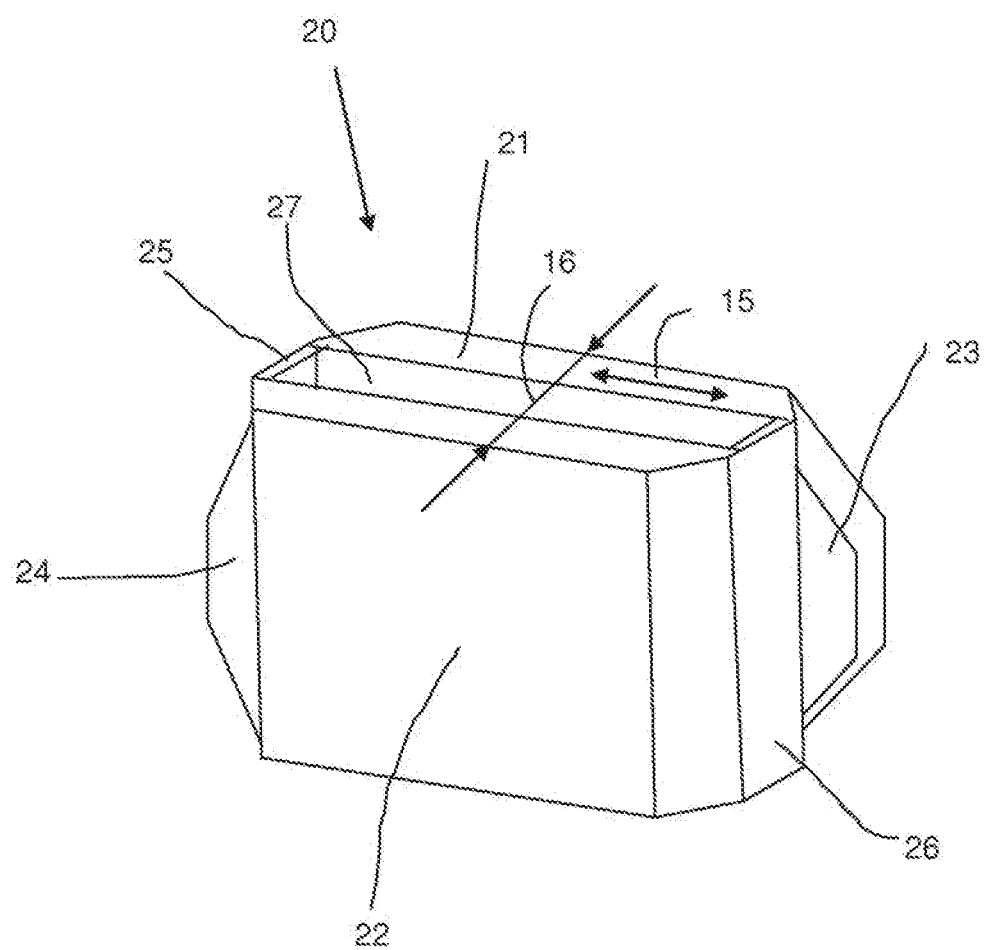
FIG. 3 shows an example of a magnet assembly.

FIG. 3 shows an example of a magnet assembly 20.

The magnet assembly 20 comprises a first magnetic body 21 and a second magnetic body 22. The first magnetic body 21 and second magnetic body 22 are in use subjected to an internal magnetic force. The direction of the internal magnetic force is indicated by arrow 16 in FIG. 3. The first magnetic body 21 and the second magnetic body 22 are in this example attracted to each other by the internal magnetic force. The internal magnetic force is directed perpendicular to the direction of actuation 15. The first and/or second magnetic body 21, 22 comprises for example a magnet, e.g. a permanent magnet and/or an iron body element.

A space 27 is provided between the first magnetic body 21 and the second magnetic body 22. At least a part of the coil assembly can be arranged in this space 27, so as to in use generate a force in the direction of actuation 15.

The magnet assembly 20 is provided with a first interface 23 which is adapted to connect the first magnetic body 21 to the object table 2, and with a second interface 24 which is adapted to connect the second magnetic body 22 to the object table 2. The first interface 23 and the second interface 24 are separate from each other.

The magnet assembly 20 further comprises a spacer device, which is adapted to hold the first magnetic body 21 and the second magnetic body 22 at a relative distance to each other in at least the direction of the internal magnetic force, thereby creating space 27. In the embodiment shown in FIG. 3, the spacer device comprises a first spacer element 25 and a second spacer element 26. These spacer elements 25, 26 hold the first magnetic body 21 and the second magnetic body 22 spaced apart from each other at such a distance that at least a part of the coil assembly 11 can be arranged between, and at a distance from, the first and second magnetic body 21, 22. The spacer elements 25, 26 hold the first magnetic body 21 and the second magnetic body 22 spaced apart from each other against the action of the internal magnetic force.

Figure 4:
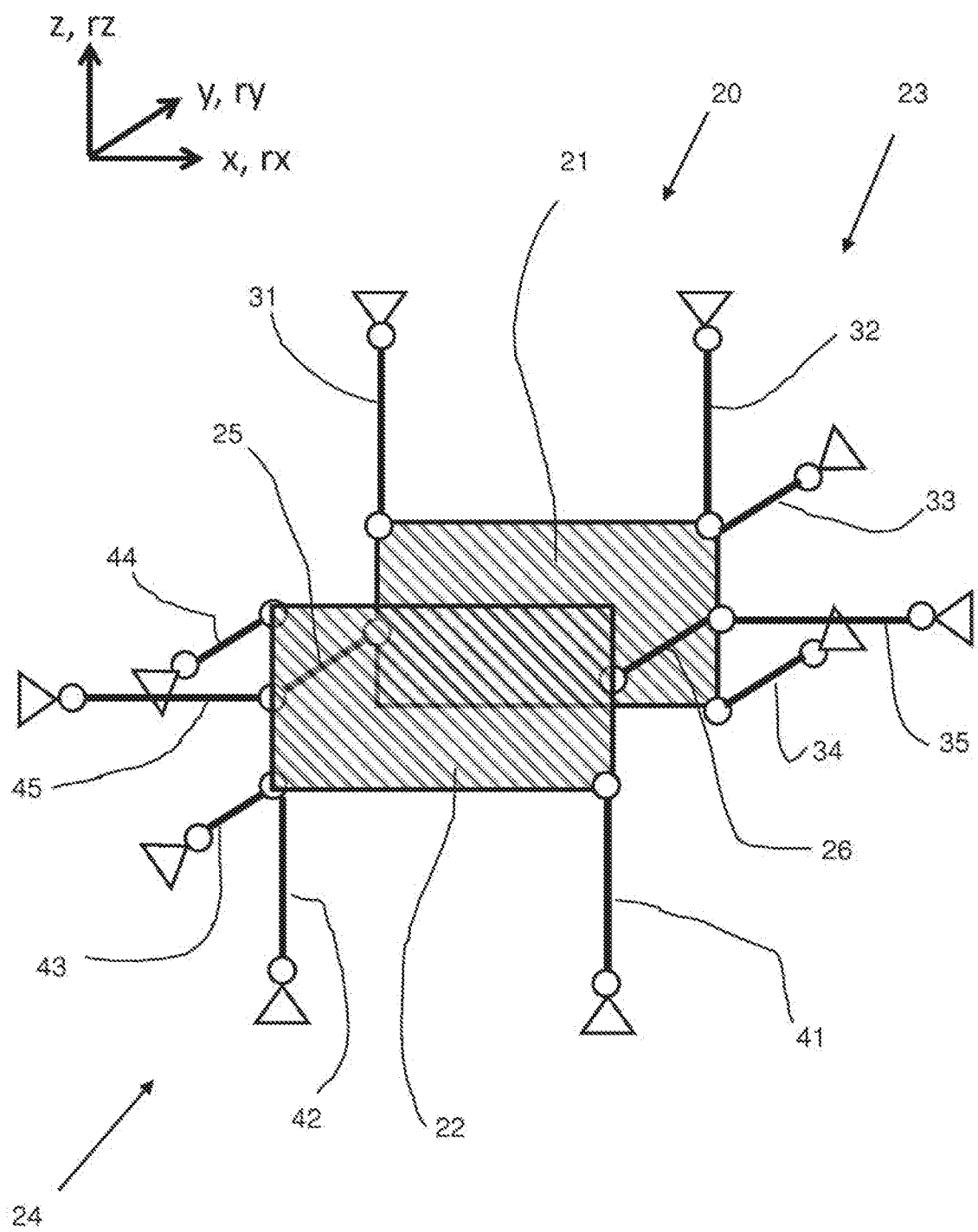
FIG. 4 schematically shows a further embodiment of a magnet assembly.

FIG. 4 schematically shows a further embodiment of a magnet assembly 20.

In the embodiment of FIG. 4, the direction of actuation is the x direction and the internal magnetic force acts in the y direction.

In this embodiment, the spacer device comprises a first spacer element 25 and a second spacer element 26. The first and second spacer elements 25, 26 are both connected to the first magnetic body 21 and to the second magnetic body 21. The first and second spacer elements 25, 26 are spaced apart from each other in the direction of actuation, which is in FIG. 4 the x direction.

In this embodiment, the first and second spacer element 25,26 together define the position of the first magnetic body 21 and of the second magnetic body 22 relative to each other in the direction of the internal magnetic force, which is in FIG. 4 the y direction. The first and second spacer element 25,26 further together define the position of the first magnetic body 21 and of the second magnetic body 22 in a rotational direction around a rotation axis which extends perpendicular to the direction of actuation as well as to the direction of the internal magnetic force. So, in the embodiment of FIG. 4, The first and second spacer element 25,26 further together define the position of the first magnetic body 21 and of the second magnetic body 22 in the rotational direction rz.

In the embodiment of FIG. 4, the first interface 23 is adapted to define the position of the first magnetic body 21 in its remaining degrees of freedom. This is schematically indicated by interface elements 31, 32, 33, 34, 35 in FIG. 4. The first interface element 31 and the second interface element 32 of the first interface 23 define the position of the first magnetic body 21 in the z direction and in the rotational ry direction. Third interface element 33 and fourth interface element 34 of the first interface 23 define the position of the first magnetic body 21 in the y direction relative to the object table 2, and in the rotational rx direction. The fifth interface element 35 of the first interface 23 defines the position of the first magnetic body 21 in the x direction relative to the object table 2.

This way, a kinematic mounting (also known as "statically determined mounting") of the first magnetic body 21 relative to the object table 2 is obtained, because such a way that all degrees of freedom related to the position of the first magnetic body 21 relative to the object table 2 are defined only once.

Figure 6:
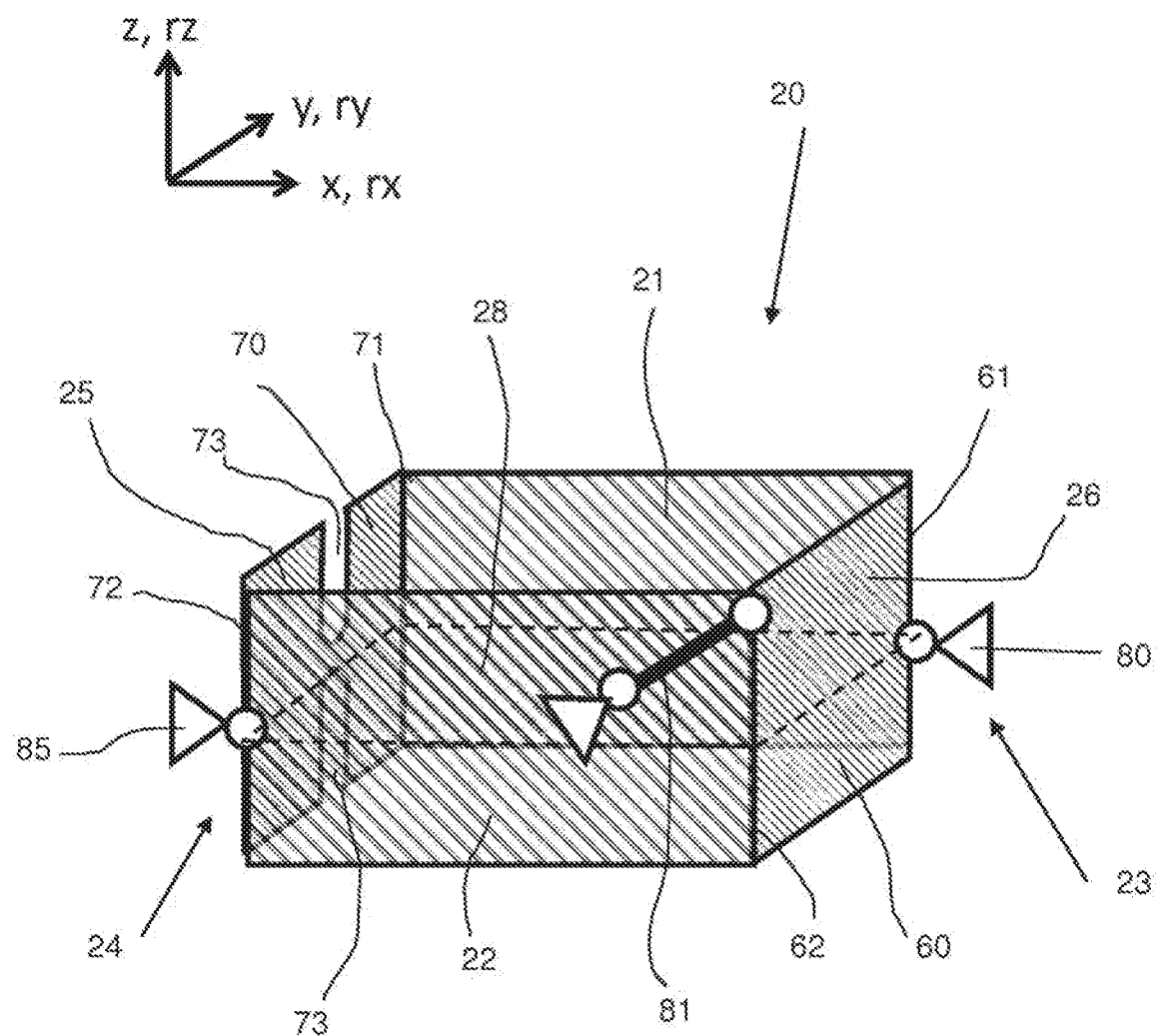
FIG. 6 schematically shows a further embodiment of a magnet assembly.

The interface elements 31, 32, 33, 34, 35 do not have to be present in the first interface 23 in the form of separate structural elements such as struts and/or pivots. The functionality of the interface elements 31, 32, 33, 34, 35 can also be obtained by structural elements that combine the functionality of two or more interface elements. Examples of such a structural element are a leaf spring or a leaf spring hinge. A leaf spring defines three degrees of freedom: the two translations in the plane of the leaf spring and the rotation about an axis perpendicular to the plane of the leaf spring. A leaf spring hinge is an adapted leaf spring which only defines two degrees of freedom, which are the two translations in the plane of the leaf spring. For example two cut-outs in the leaf spring, on opposite sides thereof and extending to the edges of the leaf spring obtain this result. FIG. 6 shows an exemplary embodiment in which a leaf spring and a leaf spring hinge are used.

In the embodiment of FIG. 4, the second interface 24 is adapted to define the position of the second magnetic body 22 in its remaining degrees of freedom. This is schematically indicated by interface elements 41, 42, 44, 44, 45 in FIG. 4. The second interface element 41 and the second interface element 42 of the second interface 24 define the position of the second magnetic body 22 in the z direction and in the rotational ry direction. Third interface element 43 and fourth interface element 44 of the second interface 24 define the position of the second magnetic body 22 in the x-direction relative to the object table 2, and in the rotational ry direction. The fifth interface element 45 of the second interface 24 defines the position of the second magnetic body 22 in the x direction relative to the object table 2.

This way, a kinematic mounting of the second magnetic body 22 relative to the object table 2 is obtained, because such a way that all degrees of freedom related to the position of the second magnetic body 22 relative to the object table 2 are defined only once.

The interface elements 41, 42, 44, 44, 45 do not have to be present in the second interface 24 in the form of separate structural elements such as struts and/or pivots. The functionality of the interface elements 41, 42, 44, 44, 45 can also be obtained by structural elements that combine the functionality of two or more interface elements. Examples of such a structural element are a leaf spring or a leaf spring hinge.

Figure 5:
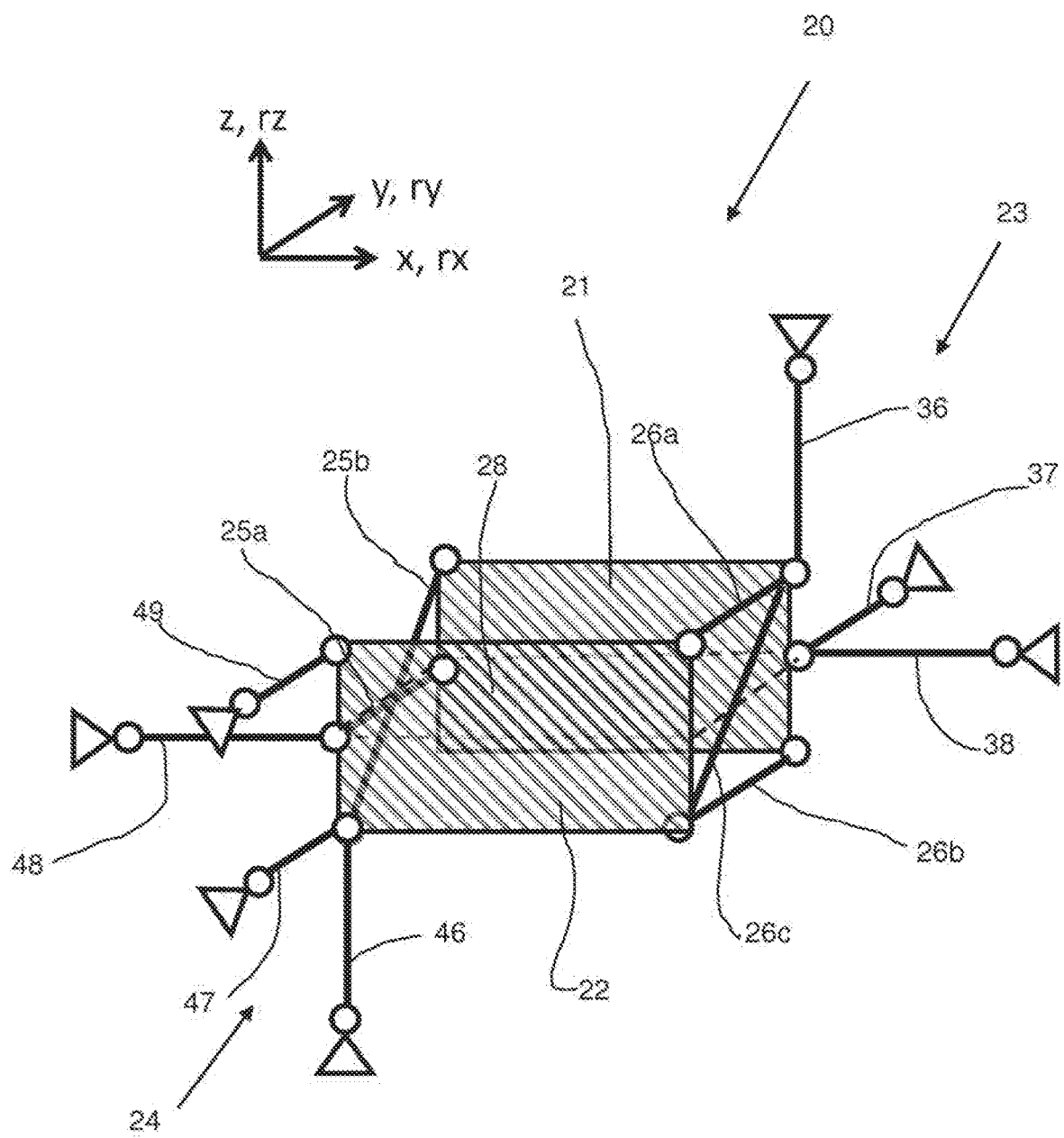
FIG. 5 schematically shows a further embodiment of a magnet assembly.

FIG. 5 schematically shows a further embodiment of a magnet assembly 20.

In the embodiment of FIG. 5, the direction of actuation is the x direction and the internal magnetic force acts in the y direction.

The embodiment of FIG. 5 has a different distribution of the definition of the degrees of freedom over the spacer device and the first and second interfaces 23, 24.

In this embodiment, the spacer device comprises a first spacer element 25 and a second spacer element 26. The first and second spacer elements 25, 26 are both connected to the first magnetic body 21 and to the second magnetic body 21.

The first and second spacer elements 25, 26 are spaced apart from each other in the direction of actuation, which is in FIG. 5 the x direction.

In this embodiment, the first spacer element 25 comprises a first spacer member 25a and second spacer member 25b. The second spacer element 26 comprises a first spacer member 26a, a second spacer member 26b and a third spacer member 26c.

The first spacer member 25a of the first spacer element 25 extends between the first and the second magnetic bodies 21, 22 in the centre plane 28 of the first and second magnetic bodies 21,22, in the direction of the internal magnetic force between the first and second magnetic bodies 21, 22, which in FIG. 5 is the y direction. The centre plane is parallel to the direction of actuation (which is the x direction in FIG. 5) and the internal magnetic force (which is the y direction in FIG. 5), so in this embodiment parallel to the x-y plane.

The second member 25b of the first spacer element 25 extends between the first and the second magnetic bodies 21, 22, crossing diagonally in the plane of the first spacer element 25. In this example, the second member 25b of the first spacer element 25 extends from the bottom corner of the second magnetic body 22 to the top corner of the first magnetic body 21 in the plane of the first spacer element 25.

The first spacer member 26a and the second space member 26b of the second spacer element 26 extend between the first and the second magnetic bodies 21, 22 in the direction of the internal magnetic force (which is the y direction in FIG. 5). The first spacer member 26a extends from the top corner of the second magnetic body 22 to the top corner of the first magnetic body 21 in the plane of the second spacer element 26. The second spacer member 26b extends from the bottom corner of the second magnetic body 22 to the bottom corner of the first magnetic body 21 in the plane of the second spacer element 26.

The third member 26c of the second spacer element 26 extends between the first and the second magnetic bodies 21, 22, crossing diagonally in the plane of the second spacer element 26. In this example, the third member 26c of the second spacer element 26 extends from the bottom corner of the second magnetic body 22 to the top-corner of the first magnetic body 21 in plane of the second spacer element 26.

By this arrangement of the spacer elements 25, 26 and their spacer members 25a, 25b, 26a, 26b, 26c, it is achieved that the position of the first and second magnetic bodies 21, 22 are defined in the y direction, the z direction and in all three rotational directions rx, ry and rz. This leaves less degrees of the freedom that have to be define by the first and second interfaces 23, 24.

In the embodiment of FIG. 5, the first interface 23 is adapted to define the position of the first magnetic body 21 in its remaining degrees of freedom. This is schematically indicated by interface, elements 36, 37, 38 in FIG. 5. The sixth interface element 36 defines the position of the first magnetic body 21 in the z direction relative to the object table 2. The seventh interface element 37 defines the position of the first magnetic body 21 in they direction relative to the object table 2. The eighth interface element 38 of the first interface 23 defines the position of the first magnetic body 21 in the x direction.

This way, a kinematic mounting of the first magnetic body relative to the object table 2 is obtained, because such a way that all degrees of freedom related to the position of the first magnetic body 21 relative to the object table 2 are defined only once. Three degrees of freedom are left to be fixed by the interface elements 46, 47, 48 of the second interface 24.

The interface elements 36, 37, 38 do not have to be present in the first interface 23 in the form of separate structural elements such as struts and/or pivots. The functionality of the interface elements 36, 37, 38 can also be obtained by structural elements that combine the functionality of two or more interface elements. Examples of such a structural element are a leaf spring or a leaf spring hinge.

In the embodiment of FIG. 5, the second interface 24 is adapted to define the position of the second magnetic body 22 in its remaining degrees of freedom. This is schematically indicated by interface elements 46, 47, 48, 49 in FIG. 5. The sixth interface element 46 defines the position of the second magnetic body 22 in the z direction relative to the object table 2. The seventh interface element 47 and the ninth interface element 49 define the position of the second magnetic body 22 in the y direction relative to the object table 2 and in the rotational direction rx relative to the object table 2. The eighth interface element 48 of the second interface 24 defines the position of the second magnetic body 22 in the x direction.

This way, a kinematic mounting of the second magnetic body 22 relative to the object table 2 is obtained, because such a way that all degrees of freedom related to the position of the second magnetic body 22 relative to the object table 2 are defined only once.

The interface elements 46, 47, 48, 49 do not have to be present in the second interface 24 in the form of separate structural elements such as struts and/or pivots. The functionality of the interface elements 46, 47, 48, 40 can also be obtained by structural elements that combine the functionality of two or more interface elements. Examples of such a structural element are a leaf spring or a leaf spring hinge.

Optionally, the interface elements 37, 38 and 38 engage the respective magnetic bodies 21, 22 in the centre plane 28, so that no bending or torsion moments are introduced in the magnetic bodies 21, 22. This has an advantageous effect on the dynamic behaviour of the object table, resulting in a high servo bandwidth and therewith in an improved positioning performance of the object table.

FIG. 6 shows a further embodiment of a magnet assembly 20.

Figure 7:
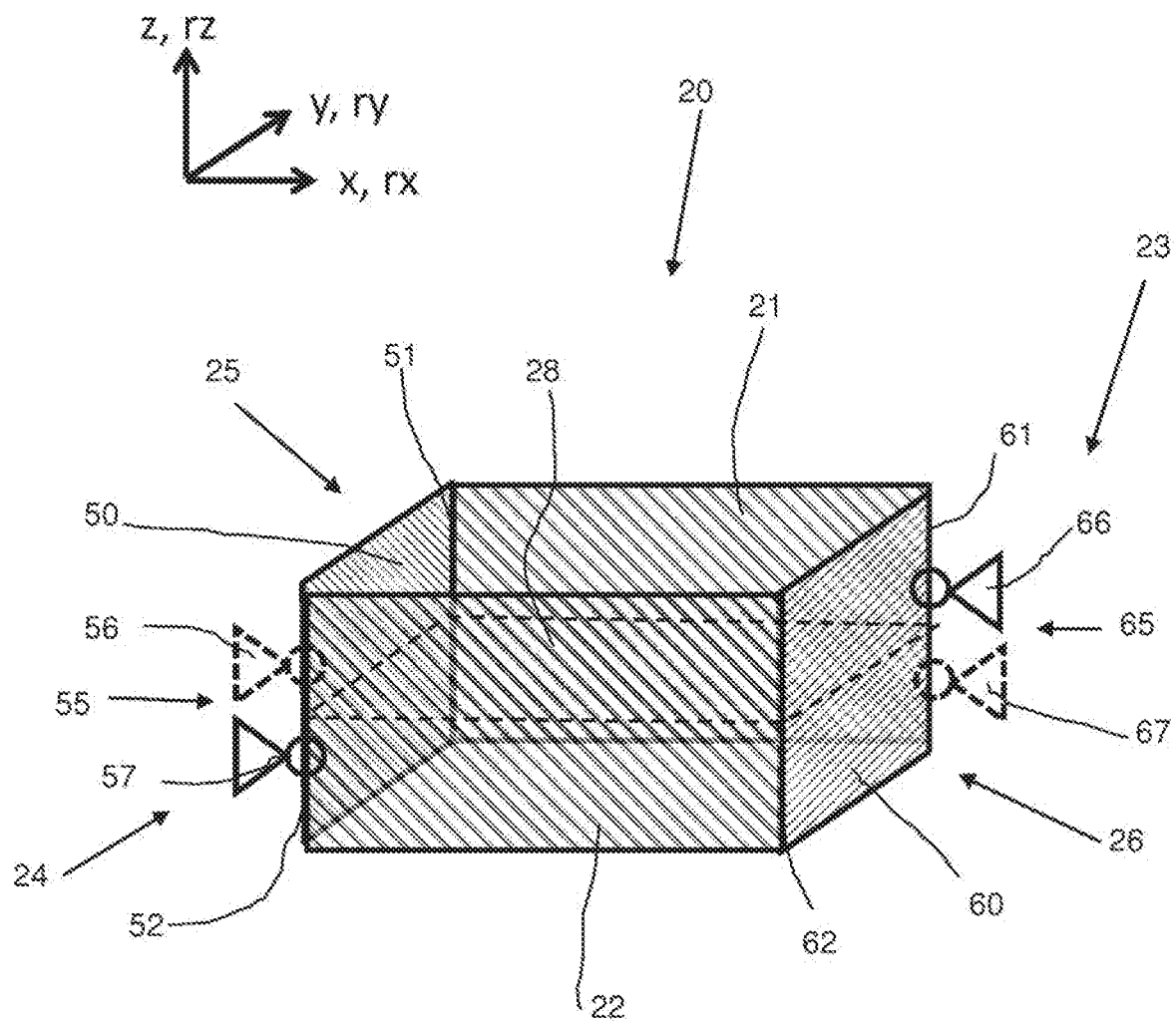
FIG. 7 schematically shows a further embodiment of a magnet assembly.

The embodiment of FIG. 6 is an embodiment that is practical to implement, although it is somewhat more complicated than the embodiment of FIG. 7. However, the embodiment of FIG. 6 is not kinematically overconstrained.

In the embodiment of FIG. 6, the direction of actuation is the x direction and the internal magnetic force acts in they direction.

In the embodiment of FIG. 6, the spacer device comprises a leaf spring 60 and a leaf spring hinge 70. The leaf spring 60 is arranged perpendicular to the direction of actuation, so in the embodiment of FIG. 6, in the y-z plane. The leaf spring 60 has a first edge 61 which is connected to the first magnetic body 21 and a second edge 62 opposite the first edge 61. The second edge 62 is connected to the second magnetic body 22. The leaf spring forms part of the second spacer element 26.

The spacer device further comprises a leaf spring hinge 70 which is arranged at a distance from the leaf spring 60 in the direction of actuation and perpendicular to the direction of actuation. So, the leaf spring hinge 70 is in the embodiment of FIG. 6 arranged in the y-z plane. The leaf spring hinge 70 has a first edge 71 which is connected to the first magnetic body 21 and a second edge 72 opposite the first edge 71. The second edge 72 is connected to the second magnetic body 22. The leaf spring 60 comprises two cut-outs 73, which are arranged on opposite sides of the leaf spring hinge 70 and extend to the respective edges of the leaf spring hinge 70. The leaf spring hinge 70 allows movement of the first and second edges 71, 72 in the rotational direction rx.

The first interface 23 comprises a first pivot 80 and a first interface element 81. The first pivot 80 is arranged at the centre plane 28 of the first magnetic element 21. The centre plane 28 is parallel to the direction of actuation and to the direction of the internal magnetic force, so in the embodiment of FIG. 6, the centre plane extends in the x-y plane.

In the embodiment of FIG. 6, the first interface element 81 is arranged at a distance from the centre plane 28 of the first magnetic body and adapted to define the position of the first magnetic body 21 in the direction of the internal magnetic force.

The second interface 24 comprises a second pivot 85. The second pivot 85 is arranged at the centre plane 28 of the second magnetic body 22, which in this embodiment coincides with the centre plane of the first magnetic body 21. The centre plane 28 is parallel to the direction of actuation and to the direction of the internal magnetic force. It is advantageous that the centre plane of the first magnetic body 21 and the centre plane of the second magnetic body coincide with each other, because then no bending or torsion moments are introduced.

FIG. 7 shows a further embodiment of a magnet assembly 20.

The embodiment of FIG. 7 is an embodiment that is practical to implement.

In the embodiment of FIG. 7, the direction of actuation is the x direction and the internal magnetic forte acts in the y direction.

So, in the embodiment of FIG. 7, the spacer device comprises a first leaf spring 50 and a second leaf spring 60. The first leaf spring 50 is arranged perpendicular to the direction of actuation, so in the embodiment of FIG. 7, in the y-z plane. The first leaf spring 50 has a first edge 51 which is connected to the first magnetic body 21, and a second edge 52 opposite the first edge 52. The second edge 52 is connected to the second magnetic body 22. Leaf spring 50 forms part of the first spacer element 25.

The spacer device further comprises a second leaf spring 60, which is arranged at a distance from the first leaf spring 50 in the direction of actuation and perpendicular to the direction of actuation. The second leaf spring 60 has a first edge 61 which is connected to the first magnetic body 21 and a second edge 62 opposite the first edge 61. The second edge 62 is connected to the second magnetic body 22. Leaf spring 60 forms part of the second spacer element 26.

In the embodiment of FIG. 7, the first interface 25 comprises a first hinge 55 which is arranged symmetrically relative to the centre plane 28 of the first magnetic body 21. The centre plane 28 is parallel to the direction of actuation and the internal magnetic force, so in the embodiment of FIG. 7 the centre plane 28 extends the x-y plane. The first hinge 55 is schematically represented in FIG. 7 by pivots 56, 57.

In the embodiment of FIG. 7, the second interface 26 comprises a second hinge 65 which is arranged symmetrically relative to the centre plane 28 of the second magnetic body 22. In the embodiment of FIG. 7, this centre plane coincides with the centre plane of the first magnetic body 21, which is advantageous because then no bending or torsion moments are introduced. The centre plane 28 is parallel to the direction of actuation and the internal magnetic force, so in the embodiment of FIG. 7 the centre plane 28 extends in the x-y plane. The second hinge 65 is schematically represented in FIG. 7 by pivots 66, 67.

In the embodiment of FIG. 7, the first leaf spring 50 and the second leaf spring 60 of the spacer device and the first hinge 55 and second hinge 65 together define the position of the first magnetic body 21 and the position of the second magnetic body 22 in all degrees of freedom. Actually, in the design of FIG. 7, some degrees of freedom are defined more than once, so the design is slightly kinematically overconstrained. However, when a magnet assembly 20 in accordance with FIG. 7 is arranged in a stage system according to the invention, the static and dynamic behaviour of the object table is still acceptable, and improved with respect to the prior art.

Figure 8:
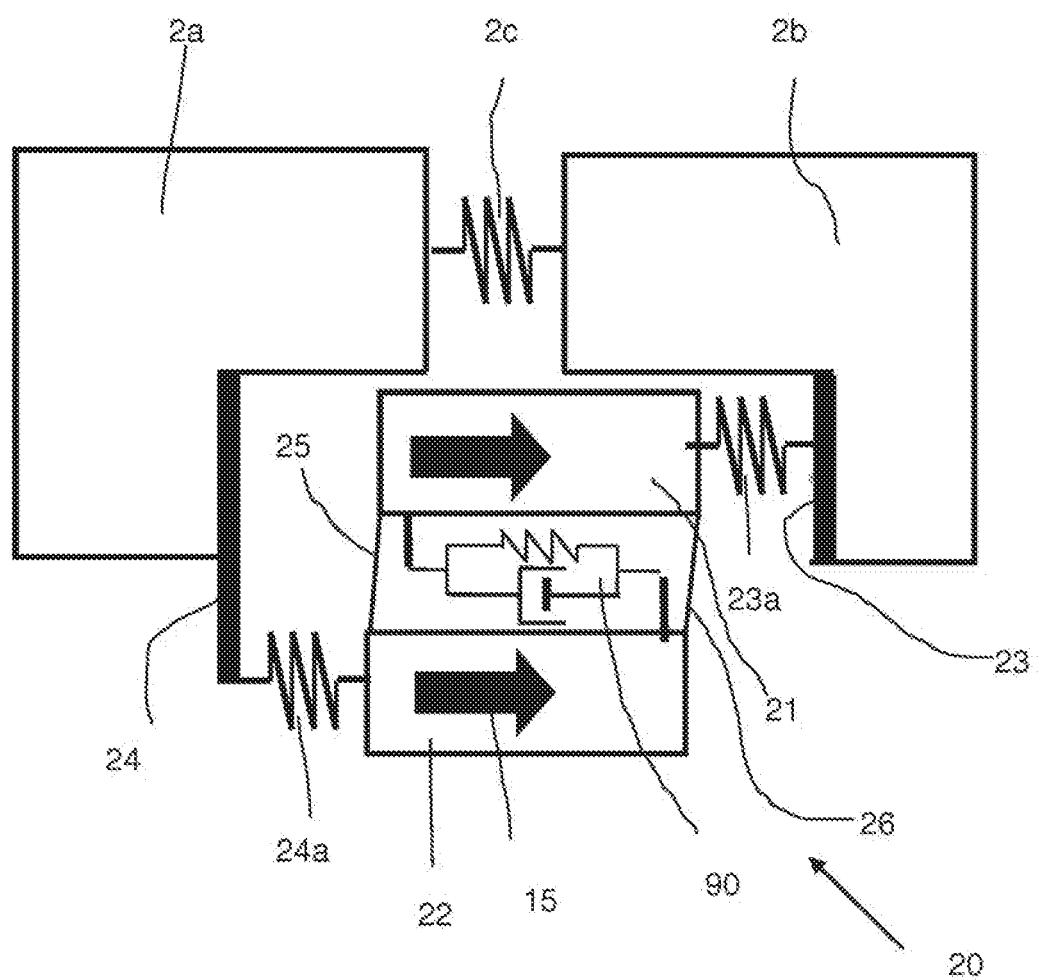
FIG. 8 schematically shows a further embodiment of a magnet assembly.

FIG. 8 shows a further embodiment of a magnet assembly 20.

For reasons of clarity, FIG. 8 does not show any details of the first and second interfaces 23,24 and of the spacer elements 25, 26. Any combination of first and second interfaces 23,24 and first and second spacer elements 25, 26 as described in this application can be used in the embodiment of FIG. 8. Arrows 15 indicate the direction of action in FIG. 8.

The embodiment of FIG. 8 can also be used in actuators that are mounted in the stage system in a way not according to the invention, as long as such an actuator comprises a first and second magnetic body which are spaced apart form each other.

In the embodiment of FIG. 8, the magnet assembly 20 comprises a damper 90, which is arranged between and connected to the first magnetic body 21 and the second magnetic body 22. Optionally, the damper 90 comprises viscoelastic material, for example a natural or synthetic rubber.

In FIG. 8, the object table is schematically indicated by reference numerals 2a, 2b and 2c. Reference numerals 2a and 2b refer to parts of the object table, each having an object table part mass, and reference numeral 2c indicates the internal stiffness of the object table. Reference numeral 2a refers to the part of the object table to which the second interface 24 is connected, and reference numeral 2a refers to the part of the object table to which the first interface 23 is connected. So, reference numerals 2a, 2b and 2c together show a dynamic model of the object table in the area where the magnet assembly 20 is connected to the object table. In practical embodiments, the object table will generally be a single solid entity.

In accordance with the invention, the first magnetic body 21 and the second magnetic body 22 are mounted separately from each other to the object table, because both have their own dedicated interface 23, 24. The stiffness of the first interface 23 is schematically indicated by reference numeral 23a. The stiffness of the second interface 24 is schematically indicated by reference numeral 24a. It has turned out that in some vibration modes of the object table, the first and second magnetic body 21, 22 of the magnet assembly 20 move relative to each other. This causes local deformation of the object table in the areas where the first and second interface engage the object table. This local deformation may cause inaccuracies in the positioning of the object.

If a damper 90 is arranged between the first magnetic body 21 and the second magnetic body 22, the relative movement of the first magnetic body 21 and the second magnetic body 22 is clamped, which reduces the local deformation of the object table.

In known configurations, a damper is present between the actuator as a whole and the object table. In such a configuration, the entire actuation force of the actuator passes through the damper at a relatively high frequency. The damper will damp vibrations this way, but on the other hand it will also be pretensioned during acceleration of the object table. This pretensioning will be relaxed when the object table is not actuated by the actuator, which is the most critical time period when the stage system is used in a lithographic apparatus.

By arranging the damper 90, in accordance with the present invention, between the first and second magnetic bodies 21, 22 of the actuator, only the relative motion of the first and second magnetic bodies 21, 22 will be damped. Such relative motion of the first and second magnetic bodies 21, 22 may be induced by internal mode shapes of the object table. The damper 90 will in that case damp these internal mode shapes, which results in an improved dynamic behaviour of the object table. In addition, the actuation force will not induce a deformation of the damper 90 if the damper 90 is arranged between the first and second magnetic bodies 21, 22 of the actuator, and therefore the damper 90 will not show relaxation during the time period when the object table is not actuated by the actuator.

In addition, when a viscoelastic damper material is used, the effects of relaxation of the damper are reduced, or in some embodiments even significantly reduced, by arranging the damper between the first magnetic body 21 and the second magnetic body 22, for example as compared to arranging the damper between the actuator and the object table, e.g. between the magnet assembly and the object table. This is because in the arrangement according to FIG. 8, the relaxation only occurs due to the difference in forces between the first and second magnetic body 21,22, which is significantly smaller than the difference in forces between the actuator and the object table, for example.

Figure 9:
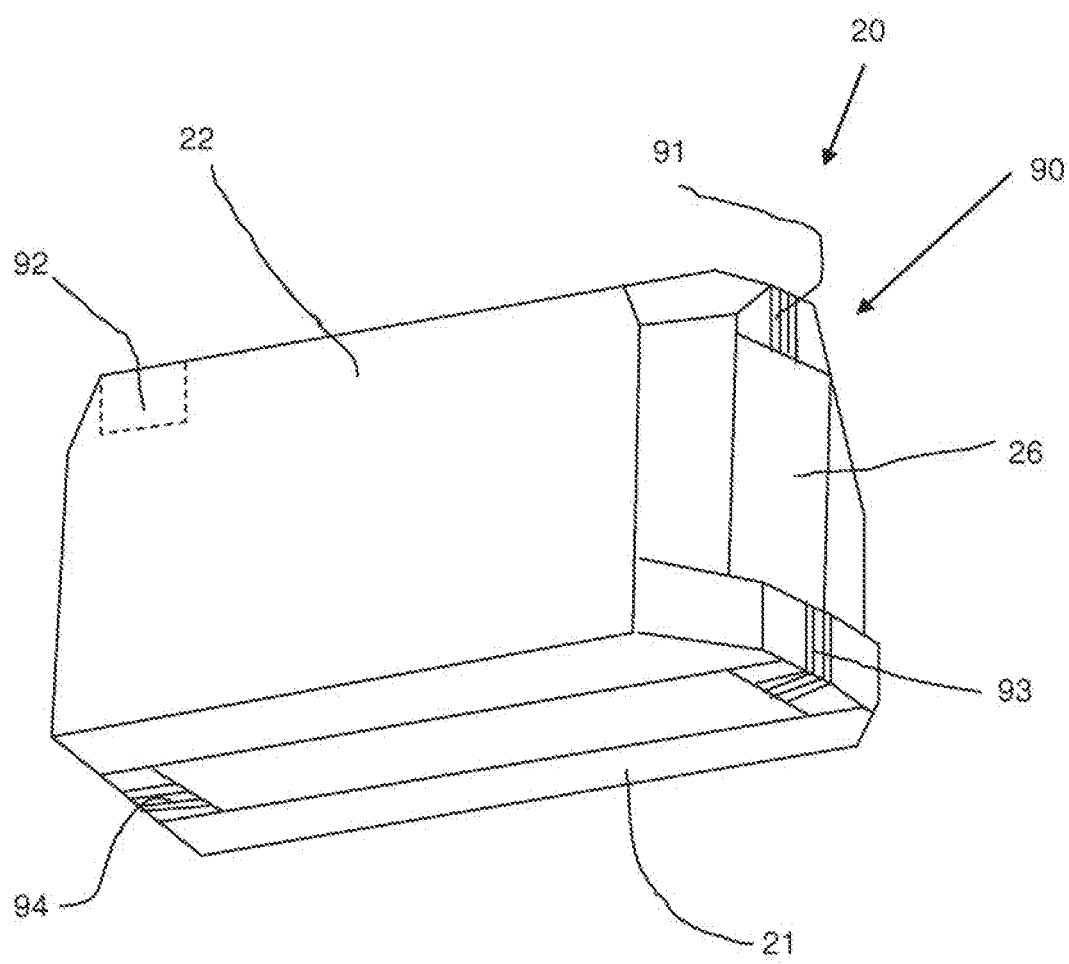
FIG. 9 shows an example of a practical implementation of the embodiment of FIG. 8.

FIG. 9 shows an example of a practical implementation of the embodiment of FIG. 8.

In the implementation of FIG. 9, four dampers 91, 92, 93, 94 made of synthetic rubber are arranged between the first and second magnetic bodies 21, 22. Three of these dampers are visible in FIG. 9. Two dampers are arranged at the top corners of the first and second magnetic bodies 21, 22 and two further dampers are arranged at the top corners of the first and second magnetic bodies 21, 22.

Figure 10:
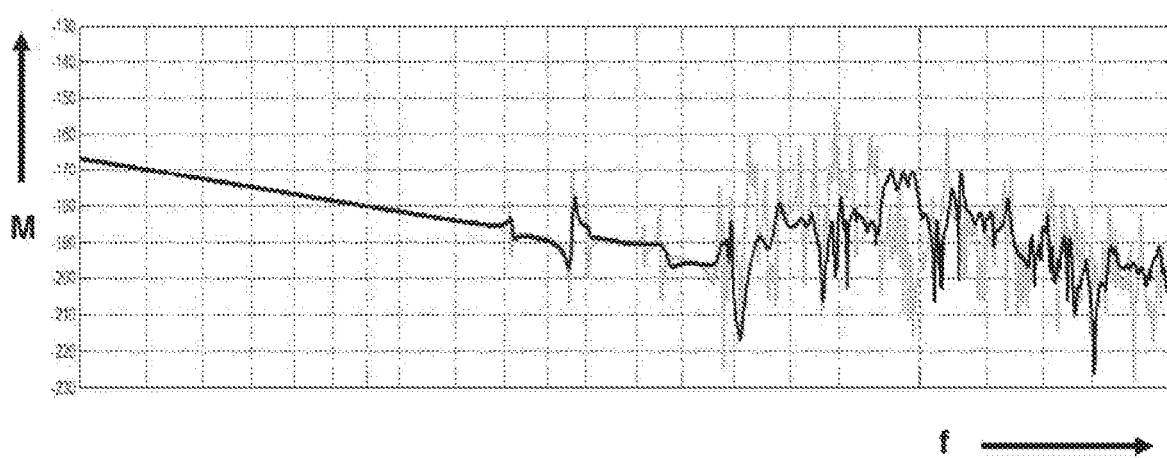
FIG. 10 shows the effect of the application of dampers in frequency response in accordance with FIG. 9.

FIG. 10 shows the effect of the application of dampers in accordance with FIG. 8 and FIG. 9 in a Bode plot (open loop mechanics).

In FIG. 10, the grey line shows the frequency response of an object table with an actuator mounted thereon without any damping. The black line shows the frequency response of an object table with an actuator mounted thereon wherein a damper is present in accordance with FIG. 8 and FIG. 9. In both cases, the input is the actuator force and the output the position. In FIG. 10, the frequency f, in Hz, is plotted on the x-axis on a log scale. On the y-axis, the magnitude in dB, in m/N is plotted, also on a log scale.

As can be seen in FIG. 10, the amplitude of the natural vibrations of several vibration modes is reduced significantly when a damper is applied in accordance with FIG. 8 and FIG. 9.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent one skilled in the art that modifications may be made to the invention as described without departing from the scope of the claims set out below.

What is claimed is:

1. A stage system for positioning an object, the stage system comprising:
   an object table adapted to support the object to be positioned, and
   a positioning system adapted to position the object table, the positioning system comprising an actuator adapted to position the object table in a direction of actuation, wherein the actuator comprises a magnet assembly and a coil assembly, and the magnet assembly comprises a first magnetic body and a second magnetic body,
   wherein the first magnetic body and second magnetic body are, in use, subjected to an internal magnetic force,
   wherein the coil assembly extends at least partly between the first magnetic body and the second magnetic body so as to, in use, generate a force in the direction of actuation,
   wherein the magnet assembly is provided with a first interface which is adapted to connect the first magnetic body to the object table, and with a second interface which is adapted to connect the second magnetic body to the object table,
   wherein the magnet assembly further comprises a spacer device, which is adapted to hold the first magnetic body and the second magnetic body at a relative distance to each other in at least the direction of the internal magnetic force,
   wherein all degrees of freedom of the first magnetic body are defined only once such that, when the first interface connects the first magnetic body to the object table, a first kinematic mounting between the first magnetic body and the object table is formed, and
   wherein all degrees of freedom of the second magnetic body are defined only once such that, when the first interface connects the first magnetic body to the object table, a second kinematic mounting between the first magnetic body and the object table is formed.

2. The stage system of claim 1,
   wherein the spacer device is adapted to define the position of the first magnetic body in at least one degree of freedom, and
   wherein the first interface is adapted to define the position of the first magnetic body in the remaining degrees of freedom.

3. The stage system of claim 2,
   wherein the spacer device is adapted to define the position of the second magnetic body in at least one degree of freedom, and
   wherein the second interface is adapted to define the position of the second magnetic body in the remaining degrees of freedom.

4. The stage system of claim 2,
   wherein the spacer device comprises a first spacer element and a second spacer element, the first and second spacer elements are both connected to the first magnetic body and to the second magnetic body, the first and second spacer elements are spaced apart from each other in the direction of actuation, and the first and second spacer element together define the position of the first magnetic body and the second magnetic body in the direction of the internal magnetic force and in a rotational direction around a rotation axis which extends perpendicular to the direction of actuation as well as to the direction of the internal magnetic force,
   wherein the first interface is adapted to define the position of the first magnetic body in its remaining degrees of freedom, and
   wherein the second interface is adapted to define the position of the second magnetic body in its remaining degrees of freedom.

5. The stage system of claim 2, wherein the spacer device comprises a leaf spring which is arranged perpendicular to the direction of actuation, the leaf spring comprises a first edge which is connected to the first magnetic body and a second edge opposite the first edge, and the second edge of the leaf spring is connected to the second magnetic body.

6. The stage system of claim 1,
   wherein the spacer device is adapted to define the position of the second magnetic body in at least one degree of freedom, and
   wherein the second interface is adapted to define the position of the second magnetic body in the remaining degrees of freedom.

7. The stage system of claim 6,
wherein the spacer device comprises a first spacer element and a second spacer element, the first and second spacer elements are both connected to the first magnetic body and to the second magnetic body, the first and second spacer elements are spaced apart from each other in the direction of actuation, and the first and second spacer element together define the position of the first magnetic body and the second magnetic body in the direction of the internal magnetic force and in a rotational direction around a rotation axis which extends perpendicular to the direction of actuation as well as to the direction of the internal magnetic force,
wherein the first interface is adapted to define the position of the first magnetic body in its remaining degrees of freedom, and
wherein the second interface is adapted to define the position of the second magnetic body in its remaining degrees of freedom.

8. The stage system of claim 6, wherein the spacer device comprises a leaf spring which is arranged perpendicular to the direction of actuation, the leaf spring comprises a first edge which is connected to the first magnetic body and a second edge opposite the first edge, and the second edge of the leaf spring is connected to the second magnetic body.

9. The stage system of claim 1,
wherein the spacer device comprises a first spacer element and a second spacer element, the first and second spacer elements are both connected to the first magnetic body and to the second magnetic body, the first and second spacer elements are spaced apart from each other in the direction of actuation, and the first and second spacer elements together define the position of the first magnetic body and the second magnetic body in the direction of the internal magnetic force and in a rotational direction around a rotation axis which extends perpendicular to the direction of actuation as well as to the direction of the internal magnetic force,
wherein the first interface is adapted to define the position of the first magnetic body in its remaining degrees of freedom, and
wherein the second interface is adapted to define the position of the second magnetic body in its remaining degrees of freedom.

10. The stage system of claim 1,
wherein the spacer device comprises a leaf spring which is arranged perpendicular to the direction of actuation, the leaf spring comprises a first edge which is connected to the first magnetic body and a second edge opposite the first edge, and the second edge of the leaf spring is connected to the second magnetic body.

11. The stage system of claim 1,
wherein the spacer device comprises a leaf spring hinge which is arranged perpendicular to the direction of actuation, the leaf spring hinge comprises a first edge which is connected to the first magnetic body and a second edge opposite the first edge, and the second edge of the leaf spring hinge is connected to the second magnetic body.

12. The stage system of claim 1,
wherein the spacer device comprises:
a first leaf spring, which is arranged perpendicular to the direction of actuation, wherein the first leaf spring comprises a first edge which is connected to the first magnetic body and a second edge opposite the first edge, and the second edge of the first leaf spring is connected to the second magnetic body, and
a second leaf spring, which is arranged at a distance from the first leaf spring in the direction of actuation and perpendicular to the direction of actuation,
wherein the second leaf spring comprises a first edge which is connected to the first magnetic body and a second edge opposite the first edge, and the second edge of the second leaf spring is connected to the second magnetic body, and
wherein the first interface comprises a first hinge which is arranged symmetrically relative to the center plane of the first magnetic body, and the center plane of the first magnetic body is parallel to the direction of actuation and the internal magnetic force, and
wherein the second interface comprises a second hinge which is arranged symmetrically relative to the center plane of the second magnetic body, and the center plane of the second magnetic body is parallel to the direction of actuation and the internal magnetic force, and
wherein the first leaf spring and the second leaf spring of the spacer device and the first hinge and second hinge together define the position of the first magnetic body and the position of the second magnetic body in all degrees of freedom.

13. The stage system of claim 1,
wherein the spacer device comprises:
a leaf spring, which is arranged perpendicular to the direction of actuation, wherein the leaf spring comprises a first edge which is connected to the first magnetic body and a second edge opposite the first edge, and the second edge of the leaf spring is connected to the second magnetic body,
a leaf spring hinge which is arranged at a distance from the leaf spring in the direction of actuation and perpendicular to the direction of actuation, wherein the leaf spring hinge comprises a first edge which is connected to the first magnetic body and a second edge opposite the first edge, and the second edge of the leaf spring hinge is connected to the second magnetic body, and
wherein the first interface comprises a first pivot and a first interface element, wherein the first pivot is arranged at the center plane of the first magnetic body, the center plane of the first magnetic body is parallel to the direction of actuation and to the direction of the internal magnetic force, and
wherein the first interface element is arranged at a distance from the center plane of the first magnetic body and adapted to define the position of the first magnetic body in the direction of the internal magnetic force, and
wherein the second interface comprises a second pivot, wherein the second pivot is arranged at the center plane of the second magnetic body, the center plane of the second magnetic body is parallel to the direction of actuation and to the direction of the internal magnetic force.

14. The stage system of claim 1,
wherein the magnet assembly further comprises a damper, which is arranged between and connected to the first magnetic body and the second magnetic body.

15. A lithographic apparatus arranged to transfer a pattern from a patterning device onto a substrate, wherein the lithographic apparatus comprises a stage system, the stage system comprising:
an object table adapted to support an object to be positioned, and
a positioning system adapted to position the object table, wherein the positioning system comprises an actuator adapted to position the object table in a direction of actuation, the actuator comprises a magnet assembly and a coil assembly, and the magnet assembly comprises a first magnetic body and a second magnetic body, wherein the first magnetic body and second magnetic body are, in use, subjected to an internal magnetic force, wherein the coil assembly extends at least partly between the first magnetic body and the second magnetic body so as to, in use, generate a force in the direction of actuation, wherein the magnet assembly is provided with a first interface which is adapted to connect the first magnetic body to the object table, and with a second interface which is adapted to connect the second magnetic body to the object table, wherein the magnet assembly further comprises a spacer device, which is adapted to hold the first magnetic body and the second magnetic body at a relative distance to each other in at least the direction of the internal magnetic force, wherein all degrees of freedom of the first magnetic body are defined only once such that, when the first interface connects the first magnetic body to the object table, a first kinematic mounting between the first magnetic body and the object table is formed, and wherein all degrees of freedom of the second magnetic body are defined only once such that, when the first interface connects the first magnetic body to the object table, a second kinematic mounting between the first magnetic body and the object table is formed.

16. The lithographic apparatus of claim 15, wherein the spacer device is adapted to define the position of the first magnetic body in at least one degree of freedom, and wherein the first interface is adapted to define the position of the first magnetic body in the remaining degrees of freedom.

17. The lithographic apparatus of claim 15, wherein the spacer device is adapted to define the position of the second magnetic body in at least one degree of freedom, and wherein the second interface is adapted to define the position of the second magnetic body in the remaining degrees of freedom.

18. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the lithographic apparatus further comprises a positioning system adapted to position the substrate table, the positioning system comprising an actuator adapted to position an object table in a direction of actuation, the actuator comprises a magnet assembly and a coil assembly, and the magnet assembly comprises a first magnetic body and a second magnetic body, wherein the first magnetic body and second magnetic body are, in use, subjected to an internal magnetic force, wherein the coil assembly extends at least partly between the first magnetic body and the second magnetic body so as to, in use, generate a force in the direction of actuation, wherein the magnet assembly is provided with a first interface which is adapted to connect the first magnetic body to the object table, and with a second interface which is adapted to connect the second magnetic body to the object table, wherein the magnet assembly further comprises a spacer device, which is adapted to hold the first magnetic body and the second magnetic body at a relative distance to each other in at least the direction of the internal magnetic force, wherein all degrees of freedom of the first magnetic body are defined only once such that, when the first interface connects the first magnetic body to the object table, a first kinematic mounting between the first magnetic body and the object table is formed, and wherein all degrees of freedom of the second magnetic body are defined only once such that, when the first interface connects the first magnetic body to the object table, a second kinematic mounting between the first magnetic body and the object table is formed.

19. A device manufacturing method comprising:

transferring a pattern from a patterning device onto a substrate using a stage system, the stage system comprising:

an object table adapted to support an object to be positioned, and a positioning system adapted to position the object table, wherein the positioning system comprises an actuator adapted to position the object table in a direction of actuation, the actuator comprises a magnet assembly and a coil assembly, and the magnet assembly comprises a first magnetic body and a second magnetic body, wherein the first magnetic body and second magnetic body are, in use, subjected to an internal magnetic force, wherein the coil assembly extends at least partly between the first magnetic body and the second magnetic body so as to, in use, generate a force in the direction of actuation, wherein the magnet assembly is provided with a first interface which is adapted to connect the first magnetic body to the object table, and with a second interface which is adapted to connect the second magnetic body to the object table, and wherein the magnet assembly further comprises a spacer device, which is adapted to hold the first magnetic body and the second magnetic body at a relative distance to each other in at least the direction of the internal magnetic force, wherein all degrees of freedom of the first magnetic body are defined only once such that, when the first interface connects the first magnetic body to the object table, a first kinematic mounting between the first magnetic body and the object table is formed, and wherein all degrees of freedom of the second magnetic body are defined only once such that, when the first interface connects the first magnetic body to the object table, a second kinematic mounting between the first magnetic body and the object table is formed.

20. A stage system for positioning an object, the stage system comprising:

an object table adapted to support the object to be positioned, and a positioning system adapted to position the object table, the positioning system comprising an actuator adapted to position the object table in a direction of actuation, wherein the actuator comprises a magnet assembly and a coil assembly, and the magnet assembly comprises a first magnetic body and a second magnetic body, wherein the first magnetic body and second magnetic body are, in use, subjected to an internal magnetic force, wherein the coil assembly extends at least partly between the first magnetic body and the second magnetic body so as to, in use, generate a force in the direction of actuation, wherein the magnet assembly is provided with a first interface which is adapted to connect the first magnetic body to the object table, and with a second interface which is adapted to connect the second magnetic body to the object table, wherein the magnet assembly further comprises a spacer device, which is adapted to hold the first magnetic body and the second magnetic body at a relative distance to each other in at least the direction of the internal magnetic force, and wherein the spacer device comprises a leaf spring which is arranged perpendicular to the direction of actuation, the leaf spring comprises a first edge which is connected to the first magnetic body and a second edge opposite the first edge, and the second edge of the leaf spring is connected to the second magnetic body.

* * * * *